(12) United States Patent (10) Patent No.: US 9,219,957 B2
Schul et al. (45) Date of Patent: Dec. 22, 2015

(54) SOUND PRESSURE LEVEL LIMITING

(71) Applicant: Imation Corp., Oakdale, MN (US)

(72) Inventors: Eran Schul, St. Paul, MN (US); Douglas K. Hogue, Woodbury, MN (US); Alan Olson, Cottage Grove, MN (US); John Bruss, Culver City, CA (US)

(73) Assignee: Imation Corp., Oakdale, MN (US)

( * ) Notice: Subject to any disclaimer, the term of this patent is extended or adjusted under 35 U.S.C. 154(b) by 340 days.

(21) Appl. No.: 13/795,307

(22) Filed: Mar. 12, 2013

(65) Prior Publication Data

US 2013/0259241 A1 Oct. 3, 2013

Related U.S. Application Data

(60) Provisional application No. 61/618,187, filed on Mar. 30, 2012.

(51) Int. Cl.
*H03G 3/20* (2006.01)
*H04R 3/00* (2006.01)
*H03G 3/32* (2006.01)
*H04R 1/10* (2006.01)

(52) U.S. Cl.
CPC ............. *H04R 3/002* (2013.01); *H03G 3/32* (2013.01); *H04R 1/1041* (2013.01); *H04R 3/007* (2013.01); *H04R 2420/07* (2013.01)

(58) Field of Classification Search
None
See application file for complete search history.

(56) References Cited

U.S. PATENT DOCUMENTS

| | | |
|---|---|---|
| 6,311,080 B1 | 10/2001 | Mochida |
| 6,555,990 B1 | 4/2003 | Yang |
| 7,888,913 B1 | 2/2011 | Marty et al. |
| 8,077,872 B2 | 12/2011 | Dyer et al. |
| 2006/0097699 A1 | 5/2006 | Kamenoff |
| 2006/0222185 A1 | 10/2006 | Dyer et al. |
| 2008/0037797 A1 | 2/2008 | Goldstein et al. |
| 2008/0130916 A1 | 6/2008 | Kong et al. |
| 2008/0137873 A1 | 6/2008 | Goldstein |
| 2009/0128097 A1 | 5/2009 | Esnard |
| 2010/0197280 A1 | 8/2010 | Hans et al. |
| 2010/0289457 A1 | 11/2010 | Onnerud et al. |
| 2010/0321193 A1 | 12/2010 | Liao et al. |
| 2012/0148062 A1 | 6/2012 | Scarlett et al. |
| 2013/0148818 A1 | 6/2013 | Yamkovoy |
| 2013/0202130 A1* | 8/2013 | Zurek et al. ............... 381/94.3 |

FOREIGN PATENT DOCUMENTS

DE 10102194 A1 8/2001

OTHER PUBLICATIONS

U.S. Appl. No. 13/772,650, filed Feb. 21, 2013.
U.S. Appl. No. 13/795,143, filed Mar. 12, 2013.

\* cited by examiner

*Primary Examiner* — Regina N Holder
(74) *Attorney, Agent, or Firm* — Dorsey & Whitney LLP

(57) ABSTRACT

Limiting the sound pressure level presented to the listener's ears by one or more headphones, using processing capabilities of a personal media device. Headphones, coupled to audio signals from a personal media device, include a sensor to measure the sound pressure level presented to the listener's ears, and provide that measure to the personal media device. The personal media device, optionally aided by one or more analog circuits, adjusts the audio signal so that the sound pressure level is maintained within a recommended range.

20 Claims, 2 Drawing Sheets

SOUND PRESSURE LEVEL LIMITING

RELATED U.S. APPLICATION DATA

This application claims priority to U.S. provisional Application No. 61/618,187, entitled SOUND PRESSURE LEVEL LIMITING, filed Mar. 30, 2012, and incorporated by reference herein.

The subject matter of this application is also related to that of the following applications, each of which is incorporated by reference herein, in its entirety for all purposes: U.S. application Ser. No. 13/772,650, entitled HEADPHONE RESPONSE OPTIMIZATION, filed Feb. 21, 2013, which claims priority to U.S. Provisional Application No. 61/601,467, filed Feb. 21, 2012; and U.S. application Ser. No. 13/795,143, entitled EXTENSIBLE SMART HEADPHONE SYSTEM, filed on even date herewith, which claims priority to U.S. provisional Application No. 61/618,158, filed Mar. 30, 2012. These documents are sometimes referred to herein as the incorporated disclosure.

BACKGROUND OF THE DISCLOSURE

Currently, MP3 players, smartphones, and other personal media devices are capable of storing songs and other media, processing those media, and generating audio signals for playing those media to a listener. When these devices are coupled to headphones, users, who have access to volume controls for these devices, might set the volume too high, with the effect that the sound pressure level coupled by the headphone speakers to the listener's ear(s) might cause possible hearing damage or hearing loss.

One method of limiting sound pressure level for headphones is to force the user to maintain only low-volume listening, for example by using low sensitivity headphones. While this method generally achieves the purpose of limiting sound pressure level to prevent hearing damage, it has the drawback that the full audio range of the headphone speaker is not available to the user.

Another method of limiting sound pressure level for headphones is to restrict the maximum volume presented by the headphone, even if the normal dynamics of music or other audio selected by the user would exceed that maximum volume. While this method generally achieves the purpose of limiting sound pressure level to prevent hearing damage, it has the drawback that the user can perceive significant distortion in the music or other audio selected by the user.

Moreover, modifying headphones to limit the emitted sound pressure level poses an engineering problem. First, modified headphones would then include circuitry which can be relatively costly. Second, modified headphones would then include circuitry which duplicates functions already available at the personal media device.

SUMMARY OF THE DISCLOSURE

We provide techniques for limiting the sound pressure level presented to the listener's ear(s) by one or more headphones, using processing capabilities of a personal media device.

A system, including one or more headphones coupled to audio signals from a personal media device, determines, in response to those audio signals, one or more measures of the sound pressure level presented to the listener's ear(s). In embodiments including more than one headphone, the system determines a separate measure of the sound pressure level as presented to each individual ear, with the effect that sound pressure level can be measured and controlled independently for each ear.

The one or more measures of sound pressure level are provided to the personal media device. The one or more measures of sound pressure level can be determined separately at more than one frequency. Measures of sound pressure level at more than one frequency can be combined, such as using A-weighting, to provide a combined measure which reflects an actual effect on the ear. Alternatively, measures of sound pressure level and what one frequency can be treated separately.

In one embodiment, the measurement signals from more than one headphone can be blended or otherwise combined into a single signal for input to the personal media device using a standard headphone plug, such as a standard 3.5 TRRS microphone connector plug, suitable for coupling to a standard headphone jack, such as might be found on an Apple iPhone™. In such embodiments, the personal media device can use either the blended or otherwise combined signals, or alternatively, might separate those measurement signals using digital signal processing. Alternatively, the measurement signals from more than one headphone can be connected to the personal media device using a multi-pin connector, such as a standard 30-pin smartphone connector, which the effect that the personal media device can receive those measurement signals independently. In either alternative, the actual connection between the headphones and the personal media device could be using a wired connection, using a wireless connection, or some combination or conjunction thereof.

The personal media device, optionally aided by one or more analog circuits coupled thereto, adjusts the audio signal it emits to the headphone(s), so that the sound pressure level presented to the listener's ear(s) is maintained within a recommended range. In embodiments including more than one headphone, the personal media device can independently adjust the audio signal it emits to the headphone associated with each individual ear.

The system includes a software interface element executed by the personal media device, which includes instructions to maintain the sound pressure level within a recommended range. The software interface element can receive signals from one or more microphones located near the listener's ear(s), determine a measure of the sound pressure level being coupled by the headphone speakers to the listener's ear(s), and adjust the audio signal to limit the sound pressure level.

The personal media device receives identifying information, using the microphone connector, with the effect that the personal media device can identify the headphone, including its particular make and model. In one embodiment, the software interface element can be launched in response to the headphone being connected to the personal media device. The software interface element can use the identifying information to adjust its settings for the headphones, including sound pressure level, equalization, and any other features controlled by the software interface element. For example, the software interface element might maintain, in memory, settings last used with respect to that particular headphone device, or could adjust settings last used with respect to an earlier headphone device to account for differences with a new headphone device.

In the figures, similar components or features might have the same reference label. Similar components or features, or those of the same type, might be distinguished by following the reference label by a dash and a second label that distinguishes them. Where only the first reference label is used, the description is applicable to any similar component having the same first reference label.

DETAILED DESCRIPTION

The ensuing description provides preferred exemplary embodiment(s) only, and is not intended to limit the scope, applicability or configuration of the disclosure. Rather, the ensuing description of the preferred exemplary embodiment(s) will provide those skilled in the art with an enabling description for implementing a preferred exemplary embodiments of the disclosure. It should be understood that various changes may be made in the function and arrangement of elements without departing from the spirit and scope of the invention as set forth in the appended claims.

Terms and Phrases

The text "personal media device" generally refers to any device capable of accessing media signals and generating audio signals for presentation to a listener. Example personal media devices include smartphones and other devices. Smartphones include, for example, the iPhone™ by Apple Corporation, as well as phones using the Android™ operating system. Other devices include, for example, the iPod™ and iPad™ by Apple Corporation, as well as other touchpads, netbooks, laptops, and personal computers.

Figures and Text

Figure 1:
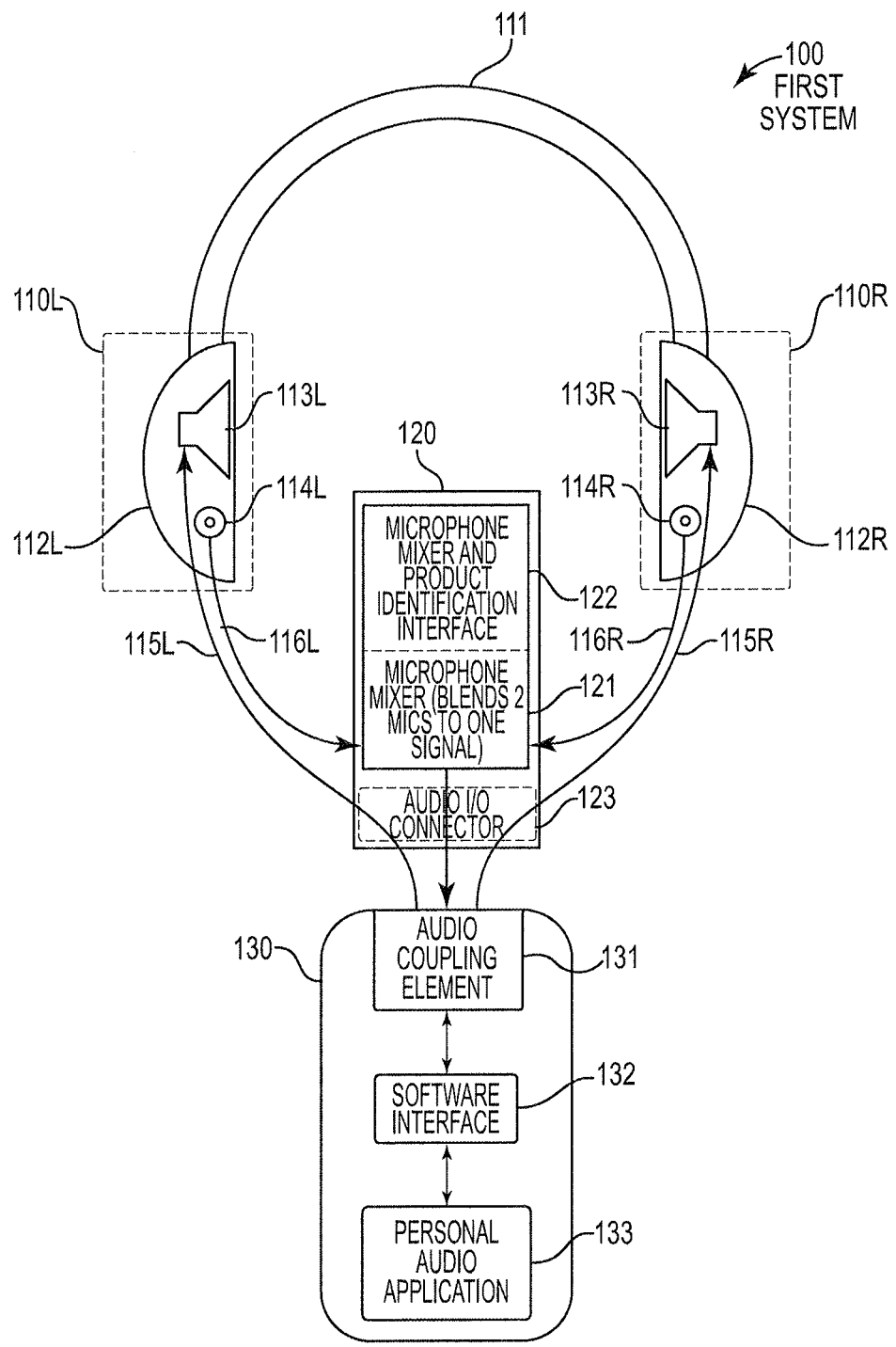
FIG. 1 shows a conceptual drawing of a first audio signal processing system.

FIG. 1 shows a conceptual drawing of a audio signal processing system.

A first system 100 includes elements shown in the figure, including at least one or more headphones 110, a headphone interface 120, and a personal media device 130. The system 100 can contain other and further components or elements as described herein, not necessarily shown in the figure. Although this application sometimes describes the system 100 with respect to a single listener's ear, in one embodiment there is a similar arrangement disposed for a listener's other ear, such as for example when headphones are matched in an assembly for both ears.

As described herein, the system 100 operates (A) to measure a sound pressure level in a listener's ear, (B) to compare that sound pressure level within a pre-selected standard (for example, a maximum sound pressure level recommended by OSHA, as described herein), and (C) to adjust any audio signals emitted into the listener's ear to account for a result of that comparison, with the effect of maintaining that sound pressure level within the pre-selected standard. These functions can be performed independently for each ear. As described herein, particular elements of the system 100 operate to perform these functions.

In one embodiment, the headphones 110 include a microphone which measures the sound pressure level and generates a signal indicating that measure, and the personal media device 130 includes a software element which operates to receive that signal indicating the measure of the sound pressure level, compares that measure with the pre-selected standard, and adjusts the audio signals emitted into the listener's ear.

Headphone(s)

In one embodiment, the system 100 includes two headphones 110L and 110R respectively for the listener's left and right ears (not shown), coupled to a headpiece 111. The headpiece 111 is capable of being fitted to the listener's head (not shown) and positioning the one or more headphones 110 next to the listener's ears. In one embodiment, the headpiece 111 is adjustable, with the effect that the listener can position the headphones 110L and 110R in their most comfortable locations or as otherwise desired.

In a first set of alternative embodiments, the headpiece 111 only positions one headphone 110 next to one of the listener's ears, possibly leaving the other one of the listener's ears open to ambient sound. In a second set of alternative embodiments, the one or more headphones 110 are positioned next to the listener's ear(s) using additional or alternative techniques.

The headphones 110 each include elements shown in the figure, including at least a headphone cup 112, a speaker 113 and a microphone 114. Each speaker 113 is coupled to a corresponding speaker line 115. Each microphone 114 is coupled to a corresponding microphone line 116.

Each speaker line 115 is coupled to its corresponding speaker 113, with the effect that audio signals on the speaker line 115 (to be presented by the speaker 113) are sent by the personal media device 130 and received by the speaker 113. Similarly, each microphone line 116 is coupled to its corresponding microphone 114, with the effect that audio signals on the microphone line 116 (as measured by the microphone 114) are sent by the microphone 114 and received by the personal media device 130.

In embodiments including two headphones 110L and 110R, each of the headphones 110 includes a corresponding one of the described elements, including a headphone cup 112L and 112R, a speaker 113L and 113R, a microphone 114L and 114R, a speaker line 115L and 115R, and a microphone line 116L and 116R.

Each headphone cup 112 is fitted around its corresponding listener's ear. For example, each headphone cup 112 might include a cushion (not shown) which is coupled to the headphone cup 112, and which surrounds or otherwise couples to the ear and forms a relatively sound-tight seal, with the effect that the sound waves emitted from the headphone cup 112 are relatively well-coupled to the ear. It is not required that sound emitted by the speaker 113 is the only sound received by the listener's ear. For example, while wearing the headphone, the listener might still be able to hear someone talking to them.

Each speaker 113 is responsive to its corresponding speaker line 115, to receive an audio input signal and to present a sound wave to its corresponding ear. Each microphone 114 is responsive to the sound wave at its corresponding ear, to provide a microphone signal corresponding to the sound pressure level of that corresponding sound wave. Where the speaker lines 115R and 115L differ, such as when presenting stereo output sound to the listener, the sound pressure level signals differ accordingly.

The two speaker lines 115R and 115L are coupled to the headphone interface 120, which provides them to the personal media device 130, as described herein. The two microphone lines 116R and 116L also are coupled to the headphone interface 120, which combines them and provides their combination to the personal media device 130, as described herein.

Sound Pressure Level

In one embodiment, the microphone 114 provides a sound pressure level signal, indicating a loudness of the sound waves being presented to the listener's ear. The sound pressure level signal is coupled from the microphone number 114, to the microphone line number 116, to the headphone interface 120, and ultimately to the personal media device 130. At the personal media device number 130, the software interface element (as described herein) receives the sound pressure level signal, compares it with a pre-selected standard, determines if any adjustment to the audio signal is desirable, and if so, adjusts the audio signal output from the personal media device 130. In embodiments including more than one headphone, the system determines a separate measure of the sound pressure level as presented to each individual ear, with the effect that sound pressure level can be measured and controlled independently for each ear.

In one embodiment, the sound pressure level signal includes a measure of loudness which is A-weighted for a set of frequencies in the listener's hearing range. This has the effect that the sound pressure level signal is responsive to loudness of the sound waves presented to the listener's ear, as they are perceived by the listener.

While this application primarily describes a system in which the sound pressure level signal includes an A-weighted signal for multiple frequencies, in the context of the invention, there is no particular requirement for any such limitation. For example, the sound pressure level signal could include multiple components, such as one component for each of a set of individual frequencies, one component for each of a set of frequency bands, or otherwise.

In one set of embodiments in which the sound pressure level has multiple components, the personal media device 130 can determine a weighted average of those multiple components, or some other combination thereof, with the effect of determining whether the sound pressure level exceeds the pre-selected standard. In another set of embodiments in which the sound pressure level has multiple components, personal media device 130 can determine whether the sound pressure level exceeds the pre-selected standard independently for each such component.

Headphone Interface

The headphone interface 120 includes elements shown in the figure, including a mixer 121, a product identification interface 122, and an audio input/output coupling element 123.

In one embodiment, the sound pressure level signals from more than one headphone can be blended or otherwise combined into a single signal by the headphone interface 120, which effect that the personal media device number 130 can receive that signal using a single coupling, such as a standard headphone connector. For example, the sound pressure level signals from more than one headphone can be summed, to provide a single sound pressure level signal, as described below. A headphone connector could include a standard 3.5 mm TRRS microphone connector, such as a microphone plug adapted for coupling to a standard headphone jack on the personal media device number 130.

The personal media device 130 can use a combined or blended sound pressure level signal, such as the summed sound pressure level signal provided by the 3.5 mm TRRS microphone connector. However, in the context of the invention there is the particular requirement for any such limitation. For example, the 3.5 mm TRRS microphone connector could be coupled to the microphones 114 and microphone lines 116 using (analog or digital) signal processing techniques which allow the two sound pressure level signals from the two individual headphones to be separated, even after they have been blended or combined by the headphone interface 120. In such embodiments, the separate sound pressure level signals could be distinguished at the personal media device 130 using digital signal processing (possibly aided by analog circuits).

In one embodiment, the mixer 121 sums the signals from the microphone lines 116R and 116L, with the effect of providing a summed microphone signal. While this application primarily describes a mixer 121 which provides a summed microphone signal, in the context of the invention, there is no particular requirement for any such limitation. For example, the mixer 121 could provide a combined signal from which each independent microphone 114R and 114L could be separated. Also for example, as described with respect to FIG. 2, the signals from each microphone 114R and 114L could be independently communicated to the personal media device 130 for independently measuring the sound pressure level. In the context of the invention, there is no particular requirement to combine signals from both ears; instead, it is possible to measure the sound pressure level, and to adjust audio signals, separately for each ear, or for one ear.

The product identification interface 122 provides the personal media device 130 with information about the particular model of headphones 110, with the effect that the personal media device 130 can determine how much to adjust the audio signal to have the desired effect on the sound pressure level. In one embodiment, the product identification interface 122 includes a memory maintaining the information about the particular model of headphones 110.

In one embodiment, the mixer 121 and the product identification interface 122 are embodied as separate physical devices. However, in the context of the invention, there is no particular requirement for any such limitation. For example, the mixer 121 and the product identification interface 122 could be embodied in the same device, could be emulated in the same device as separate devices, or other and further possibilities.

In one embodiment, the audio input/output coupling element 123 includes a first connector which is electrically and mechanically coupleable to the headphone 110, and a second connector which is electrically and mechanically coupleable to the personal media device 130. For example, the audio input/output coupling element 123 could include a headphone plug, such as a 3.5 mm TRRS ("tip, ring, ring, sleeve" or sometimes, "tip, ring, ring, shield") connector, which is capable of providing two speaker signals output from the personal media device 130 and coupleable to the speaker lines 115L and 115R, and capable of providing a microphone signal output from the headphone interface 120 and input to personal media device 130.

In alternative embodiments, either the first connector or the second connector, or both, need not be both electrically and mechanically coupleable, but might instead include (at least in part) a wireless connections, such as one using the Bluetooth™ wireless connection standard. In first alternative embodiments, the headphone 110 might be coupled to the audio input/output coupling element 123 using the Bluetooth™ wireless connection standard. Similarly, in second alternative embodiments, the audio input/output coupling element 123 might be coupled to the personal media device number 130 using the Bluetooth™ wireless connection standard.

While this application describes wireless connections with respect to the Bluetooth™ wireless connection standard, in the context of the invention, there is no particular requirement for any such limitation. For example, another wireless connection standard, or another form of wireless connection, could be used in addition to, or in lieu of, a wired connection, either for the first connection or for the second connection.

Similarly, while this application describes an audio input/output coupling element 123 which includes a 3.5 mm TRRS connector, in the context of the invention, there is no particular requirement for any such limitation. For example, but not by way of limitation:

(1) the audio input/output coupling element 123 could include a plug, electrically and mechanically coupled to the headphone 110;
(2) the audio input/output coupling element 123 could include a plug which is electrically coupled to the headphone 110, but whose mechanical coupling includes a cable, wire, or other technique by which the audio input/output coupling element 123 is mechanically separate from the headphone 110;
(3) the audio input/output coupling element 123 could include a plug which is separated both electrically and mechanically from the headphone 110, such as a separate device which provides a plug to be coupled to the jack on the personal media device 130, and for which the plug can be wirelessly or otherwise remotely coupled to the headphone 110. Other and further wireless possibilities are discussed herein.

Thus, the audio input/output coupling element 123 is optionally disposed either as part of, or outside, the headphone interface 120. While this application primarily describes a first system 100 in which the audio input/output coupling element 123 is disposed outside headphone interface 120, in the context of the invention, there is no particular requirement for any such limitation. Moreover, the audio input/output coupling element 123 could be disposed in multiple parts, at least some of which are disposed as part of the headphone interface 120, and at least some of which are disposed outside the headphone interface 120.

The summed microphone signal is communicated to the audio input/output coupling element 123, with the effect of providing a sound pressure level signal to the personal media device 130. The two speaker lines 115R and 115L are coupled to the audio input/output coupling element 123, with the effect of providing stereo output from the personal media device 130.

The summed microphone signal is communicated to an audio input of the personal media device 130, with the effect that the personal media device 130 can determine a sound pressure level measured by one of the microphones 114. In one embodiment, as described herein, the personal media device 130 can distinguish between sound pressure level measures for the listener's two ears by coupling only one of the speaker lines 115R or 115L at a time, with the effect of limiting the summed microphone signal to only one of the microphone lines 116R and 116L at a time.

Personal Media Device

The personal media device 130 includes elements shown in the figure, including at least an audio coupling element 131, a software interface element 132, and a personal audio application 133. The personal media device 130 includes one or more processors (not shown), and has access to one or more memories or storage devices (not shown).

The one or more processors accessible by the personal media device 130 might include one or more digital processors, such as devices made by ARM™ or Intel™. The one or more memories or storage devices might include any form of memory device or mass storage device coupleable to the personal media device 130. The personal media device 130 might also maintain digital information in memories or storage devices accessible by the personal media device 130 using a wired or wireless communication network.

The audio coupling element 131 is disposed for connection with the audio input/output coupling element 123. In one embodiment, the audio coupling element 131 includes a headphone jack connector coupleable to a 3.5 mm TRRS coupling element (such as a 3.5 mm TRRS plug), with the effect of being coupleable to the audio input/output coupling element 123.

In one embodiment, the functions of the audio coupling element 131 could include standard media control functions, including EJECT, FAST-FORWARD, PAUSE, PLAY, REWIND, SKIP, STOP, and optionally otherwise. Similarly, the functions of the audio coupling element 131 could also include standard volume functions, including controls for decreasing or increasing loudness, adjusting pitch, or applying pre-selected equalization functions.

In alternative embodiments, the audio coupling element 131 may also be coupled to a microphone (not shown), such as one disposed in line between the headphone 110 and the personal media device 130. In such alternative embodiments, the microphone may be used for speech input or output. The microphone may be used for voice-activated commands or other voice control of either the headphone 110, the personal media device 130, or both.

The personal audio application 133 includes either a set of operating system instructions, or a set of application program instructions executing under control of those operating system instructions, to provide an audio signal intended for presentation to the listener. For example, the personal audio application 133 might include the iTunes™ program available from Apple Corporation, or a program with relatively similar capabilities. The personal audio application 133 is coupled to a set of coded audio, and provides an audio signal in response to that coded audio. For a first example, the coded audio includes a set of digitized audio signals maintained in a memory accessible by the personal media device 130, such as an MP3 file. For a second example, the coded audio includes a set of audio signals received in streaming form using a wired or wireless connection by the personal media device 130, such as a streaming audio file, whether real-time or pre-recorded.

The personal media device 130, compares the sound pressure level signal with the pre-selected standard, determines whether the sound pressure level signal exceeds that standard, and if so, adjusts the audio signals emitted by the personal audio application 133. This has the effect of maintaining the audio signals emitted by the personal audio application 133 to begin the pre-selected standard.

Software Interface Element

The software interface element 132 is coupled to the audio coupling element 131 and to the personal audio application 133. The software interface element 132 operates under control of program instructions to perform functions as described in this application. In those cases where those program instructions are not described in detail, those skilled in the art, after reading this application, would understand the particular techniques, computations, and program instructions, and would be able to make and use the same, without undue experimentation or further invention.

The software interface element 132, using the processing capability of the personal media device 130, performs signal processing described herein, to adjust the stereo output from the personal media device 130. Using the processing capability of the personal media device 130 has the effect that the software interface element 132 can perform general digital signal processing operations on microphone signals incoming to the personal media device 130 and on speaker signals outgoing from the personal media device 130.

In one embodiment, the software interface element 132 operates to perform functions of controlling the headphones 110, including the speaker 113, microphone 114, and audio signals. Where the system 100 is described as performing control functions, these functions are generally performed by the software interface element 132.

In one embodiment, the software interface element 132 receives information with respect to the sound pressure level from the audio coupling element 131. As described herein, the microphone lines 116R and 116L are summed by the mixer 121, providing a summed microphone signal, which is coupled to the audio input/output coupling element 123, which is coupled to the audio coupling element 131. In one embodiment, the software interface element 132 is able to determine the sound pressure level for individual headphones 110L and 110R by waiting for a time when only one output speaker 113L or 113R is active, and measuring the summed microphone signal at that time. Since, at that time, only one output speaker 113L or 113R is active, the summed microphone signal includes only sound pressure from that individual headphone 110L or 110R.

In one embodiment, the software interface element 132 maintains a record, in any one or more memories or storage devices accessible to the personal media device 130, of the sound pressure level signal for each individual headphone 110L and 110R (with the effect of maintaining a record of the sound pressure level for each corresponding ear). The software interface element 132 determines an average sound pressure level for a recent set of measurements. In response thereto, the software interface element 132 determines whether the average sound pressure level exceeds a recommended sound pressure level range.

If the software interface element 132 determines that the average sound pressure level exceeds the recommended sound pressure level range, it adjusts the audio signal it receives from the personal audio application 133. In one embodiment, the software interface element 132 determines a ratio by which the average sound pressure level exceeds the recommended sound pressure level range, and reduces the volume of the audio signal by at least that ratio.

Adjusting the stereo output from the personal media device 130 has the effect of maintaining the sound pressure level output by the each of the speakers 113L and 113R within a predetermined range. In one embodiment, this predetermined range is within the sound pressure level range recommended by OSHA (the Occupational Safety and Health Administration) in the United States, or by any equivalent body outside the United States. For example, the stereo output from the personal media device 130 could be maintained to less than or equal about 74 dB SPL (decibels of sound pressure level) for the octave band centered at about 4 KHz (kilohertz), and possibly other sound pressure levels for other known frequency bands.

The personal audio application 133 includes either a set of operating system instructions, or a set of application program instructions executing under control of those operating system instructions, to provide an audio signal intended for presentation to the listener. For example, the personal audio application 133 might include the iTunes™ program available from Apple Corporation, or a program with relatively similar capabilities. The personal audio application 133 is coupled to a set of coded audio, and provides an audio signal in response to that coded audio. For a first example, the coded audio includes a set of digitized audio signals maintained in a memory accessible by the personal media device 130. For a second example, the code audio includes a set of audio signals received in streaming form using a wired or wireless connection by the personal media device 130.

Second System

Figure 2:
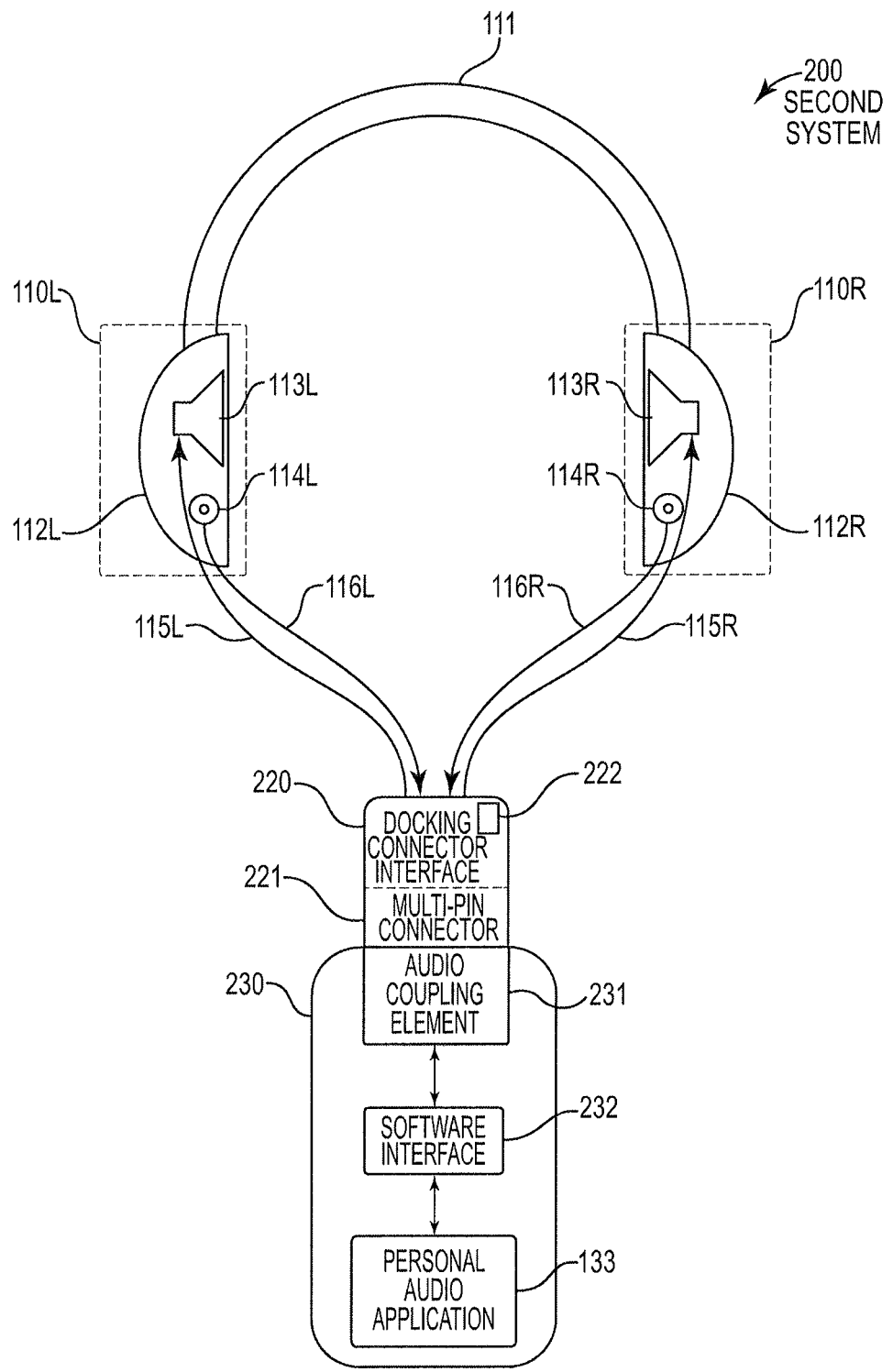
FIG. 2 shows a conceptual drawing of a second audio signal processing system.

FIG. 2 shows a conceptual drawing of a second audio signal processing system.

A second system 200 includes elements shown in the figure, including at least one or more headphones 110, a docking interface 220, and a personal media device 230. The system 100 can contain other and further components or elements as described herein, not necessarily shown in the figures.

The second system 200 includes one or more headphones 110 similar to those described with respect to the first system 100.

The second system 200 includes a personal media device 230 similar to the personal media device 130 described with respect to the first system 100, with at least the difference that the audio coupling element 231 is disposed for coupling to the docking interface 220 (as described below), rather than for coupling to the headphone interface 120 (as described with respect to the first system 100). The software interface element 232 in the personal media device 230 is disposed at least for operation with the docking interface 220, rather than for with the headphone interface 120.

Operation of the second system 200 is similar to operation of the first system 100, with at least the difference that the docking interface 220 and the audio coupling element 231 operate differently from the headphone interface 120. The docking interface 220 and the audio coupling element 231 operate in conjunction with the software interface element 232, with the effect that the software interface element 232 can make use of analog circuits in the docking interface 220.

Docking Interface

The docking interface 220 includes elements shown in the figure, including at least a multi-pin connector 221 and an (optional) set of one or more analog circuits 222.

The personal media device 130 receives identifying information, using the microphone connector, describing the headphone 110. This has the effect that the personal media device 130 can identify the headphone 110, such as, for example, its particular make and model. The personal media device 130 can act in response to this identifying information, such as (A) initializing and starting up in response to the identifying information, (B) recalling or setting parameters for the headphones 110 in response to the identifying information, (C) acting with respect to the headphones 110 in response to the identifying information, or some combination or conjunction thereof, or otherwise.

The software interface element 132 can be launched in response to event of the headphone 110 being connected to the personal media device 130. When the software interface element 132 is launched, it can determine whether there is one headphone 110 or there are two headphones 110, and act accordingly with respect to sound pressure level limitation. The software interface element 132 could also warn the listener if the identifying information is in any way unusual, such as if the identifying information represents that there are two headphones 110, but the software interface element 132 can detect the sound pressure level signal from only one of them.

The software interface element 132 can use the identifying information to adjust its settings for the headphones 110, including sound pressure level, equalization, and anything else affected or controlled by the software interface element 132. The software interface element 132 might maintain, in memory or otherwise accessible, settings last used with respect to that particular headphone 110. The software interface element 132 could also adjust its settings in response to settings used by an earlier, different, headphone 110 to account for differences with a new headphone device. For example, if the listener has switched from headphone type "A" to headphone type "B", the software interface element 132 could use the settings from headphone type "A", modified to account for differences egos of for headphone type "B".

The software interface element 132 can use the identifying information to determine if features it controls are available for the particular headphones 110, including sound pressure level, equalization, and anything else affected or controlled by the software interface element 132. For example, when adjusting audio signals emitted by the personal media device 130 to maintain those audio signals within the pre-selected standard, the software interface element 132 can make use of knowledge about how soft the audio signals can be and still be clearly distinguished by the listener when presented by that particular make and model of headphones 110.

In one embodiment, the docking interface 220 is capable of separately coupling the speaker signals outbound from the personal media device 230, capable of separately coupling the microphone signals inbound to the personal media device 230, and is coupleable to the personal media device 230 at a related audio coupling device 231. Similar to the headphone interface 120, the software interface element 232 in the personal media device 230 can determine, from the microphone signals, whether the sound pressure level should be adjusted and by how much. Similar to the headphone interface 120, the software interface element 232 in the personal media device 230 can adjust the sound pressure level, using the speaker signals.

In one embodiment, the multi-pin connector 221 includes a standard 30-pin connector used with iPhone™ products from Apple Computer. In alternative embodiments, the docking interface 220 includes other types of connectors which might be compatible with Android™ type devices or other devices. In the standard 30-pin connector, and in related types of connectors, the signals from the microphones 114R and 114L are independently coupled to the personal media device 130. This has the effect that the personal media device 130 can independently examine the signals from the microphones 114R and 114L, independently determine the sound pressure level for each ear, and independently adjust the audio signal emitted to each ear. In embodiments using the standard 30-pin connector, and in related types of connectors, there is no requirement to sum the signals from the microphones 114R and 114L.

Correspondingly, in the personal media device 230, the audio coupling element 231 is disposed for connection with the multi-pin connector 221. In one embodiment, the audio coupling element 231 includes a corresponding connector coupleable to the multi-pin connector 221.

Similar to the first system 100, in embodiments of the second system 200, the multi-pin connector 221 includes a first connector which is electrically and mechanically coupleable to the headphone 110, and a second connector which is electrically and mechanically coupleable to the personal media device 230.

Similar to the first system 100, in alternative embodiments of the second system 200, either the first connector or the second connector, or both, need not be both electrically and mechanically coupleable, but might instead include (at least in part) wireless connections, such as using the Bluetooth™ wireless connection standard. In a first set of such alternative embodiments, the headphone 110 might be coupled to the multi-pin connector 221 using the Bluetooth™ wireless connection standard. Similarly, in a second set of such alternative embodiments, the multi-pin connector 221 might be coupled to the personal media device number 130 using the Bluetooth™ wireless connection standard.

In one embodiment, the one or more analog circuits 222 are embodied in the docking interface 220, and are digitally controllable by the software interface element 232 in the personal media device 230. The one or more analog circuits 222 might include a set of multiple analog audio correctors (for adjusting sound pressure level) which the software interface element 232 can select from.

For a first example, the multiple analog equalizers could include individual audio correctors, each of which adjusts the sound pressure level by a different amount. This has the effect that the software interface element 232 can select one of the multiple analog equalizers to select by how much to adjust the sound pressure level.

For a second example, the multiple analog equalizers could include individual audio correctors, each of which adjusts the sound pressure level for a different frequency band. This has the effect that the software interface element 232 can select one or more of the multiple analog equalizers to adjust the sound pressure level in each of several frequency bands.

Similar to the first system 100, in the second system 200, the software interface element 232 controls the docking interface 220 to send signals to the speaker 113 and to receive signals from the microphone 114. This has the effect that the software interface element 232 can receive the signal indicating the sound pressure level as measured by the microphone 114, and adjust the emitted audio signal from the personal media application 133 to the speaker 113.

Similar to the first system 100, in the second system 200, the software interface element 232 compares the response measured by the microphone 114 with the pre-selected standard. Similar to the first system 100, in the second system 200, the software interface element 232 determines from the measured sound pressure level, whether to adjust the audio signals emitted from the personal media device 130, and can perform digital signal processing to adjust those audio signals.

As described above, in embodiments which include one or more analog circuits 222, the software interface element 232 generates one or more control signals for those analog circuits 222. For example, the software interface element number 232 select one or more sets of parameters for those analog devices. These parameters might include one more sets of parameters for a parametric equalization filter, or another type of filter, to be applied by those one or more analog devices.

The foregoing merely illustrates the principles of the disclosure. Various modifications and alterations to the described embodiments will be apparent to those skilled in the art in view of the teachings herein. It will thus be appreciated that those skilled in the art will be able to devise numerous systems, arrangements, and procedures which, although not explicitly shown or described herein, embody the principles of the disclosure and can be thus within the spirit and scope of the disclosure. Various different exemplary embodiments can be used together with one another, as well as interchangeably therewith, as should be understood by those having ordinary skill in the art. It should be understood that the exemplary procedures described herein can be stored on any computer accessible medium, including a hard drive, RAM, ROM, removable disks, CD-ROM, memory sticks, etc., and executed by a processing arrangement and/or computing arrangement which can be and/or include a hardware processors, microprocessor, mini, macro, mainframe, etc., including a plurality and/or combination thereof. In addition, certain terms used in the present disclosure, including the specification, drawings and numbered paragraphs thereof, can be used synonymously in certain instances, including, but not limited to, e.g., data and information. It should be understood that, while these words, and/or other words that can be synonymous to one another, can be used synonymously herein, that there can be instances when such words can be intended to not be used synonymously. Further, to the extent that the prior art knowledge has not been explicitly incorporated by reference herein above, it is explicitly incorporated herein in its entirety. All publications referenced are incorporated herein by reference in their entireties.

The invention claimed is:

1. A method, including:
    measuring a sound pressure level next to a listener's ear;
    comparing said sound pressure level with a pre-selected value; and
    adjusting an audio signal emitted into said listener's ear, in response to a result of said comparing;
    wherein said measuring includes obtaining a first sound pressure level next to said listener's first ear, and separately obtaining a second sound pressure level next to said listener's second ear; and
    combining said first sound pressure level and said second sound pressure level;
    wherein said adjusting is performed at one or more of said listener's ears, in response to a result of said combining.

2. A method as in claim 1, wherein said adjusting includes adjusting a first audio signal emitted into said listener's first ear, and separately adjusting a second audio signal emitted into said listener's second ear.

3. A method as in claim 1, wherein said comparing and said adjusting are performed by a personal media device including a software element which operates to receive a signal indicating said sound pressure levels, compare said sound pressure levels with a pre-selected standard maximum sound pressure level, and adjust said audio signal to maintain said first and second sound pressure levels within said standard.

4. A method as in claim 3, wherein:
    said software element of said personal media device includes an application program disposed to receive an output from an audio signal generator; and
    said application program performs said adjusting by altering said output and maintaining said sound pressure levels at a value less than said standard to prevent damage to said user's ears.

5. A method as in claim 1, wherein said adjusting includes detecting a type of headphone next to said listener's ear, and wherein said adjusting is responsive to a result of said detecting.

6. A method as in claim 5, wherein said detecting includes receiving a signal from a product identification interface at said headphone.

7. A method as in claim 1, wherein said measuring includes detecting which, of a first headphone and a second headphone, is next to a listener's first ear; and wherein said adjusting is responsive to a result of said detecting.

8. A method as in claim 1, wherein said measuring includes disposing a headphone next to said listener's ear, said headphone including a speaker and an acoustic sensor; and
    receiving a signal indicating sound pressure level from said acoustic sensor, in response to a known audio signal emitted into said listener's ear.

9. A method as in claim 1, wherein said combining includes summing said first sound pressure level and said second sound pressure level.

10. A method as in claim 1, including:
    de-combining a result of said combining;
    wherein said adjusting includes adjusting a first audio signal emitted into said listener's first ear, and separately adjusting a second audio signal emitted into said listener's second ear.

11. A method as in claim 1, wherein said measuring includes obtaining a separate measurement of said sound pressure level at more than one frequency.

12. A method as in claim 11, including:
    combining said separate measurements of sound pressure level;
    wherein said comparing and said adjusting are responsive to a result of said combining.

13. A method as in claim 12, wherein said combining includes A-weighting.

14. Apparatus including:
    a personal media device including a processor, non-transitory memory, and an audio signal generator;
    said non-transitory memory including instructions interpretable by said processor as an application program disposed to:
        receive an output from said audio signal generator,
        receive a measure of a sound pressure level next to a listener's ear, and
        compare said sound pressure level with a pre-selected value,
        wherein said measure includes a first sound pressure level obtained next to said listener's first ear and a second sound pressure level separately obtained next to said listener's second ear,
        combine said first sound pressure level and said second sound pressure level, and
        adjust an audio signal emitted into said listener's ear, in response to a result of said comparing, by altering said output and maintaining said sound pressure level at a value less than a pre-selected value;
        wherein said audio signal is adjusted at one or more of said listener's ears, in response to said result of combining.

15. Apparatus as in claim 14, including:
    a first headphone disposed next to a listener's first ear, said first headphone including a first speaker and a first acoustic sensor;
    a second headphone disposed next to said listener's second ear, said second headphone including a second speaker and a second acoustic sensor;
    wherein said first speaker, said first acoustic sensor, said second speaker, and said acoustic sensor are coupled to said personal media device.

16. Apparatus as in claim 15, including a mixer coupling said personal media device to said first acoustic sensor and said second acoustic sensor.

17. Apparatus as in claim 14, including:
    a headphone disposed next to said listener's ear, said headphone including a speaker and an acoustic sensor;
    wherein said speaker and said acoustic sensor are coupled to said personal media device.

18. Apparatus as in claim 14, wherein said value is a standard maximum sound pressure level pre-selected to prevent hearing damage.

19. A non-transitory data storage medium maintaining computer-readable instructions thereon, said instructions executable on a processor for directing the processor to:
    measure a sound pressure level next to a listener's ear;
    compare said sound pressure level with a pre-selected value; and
    adjust an audio signal emitted into said listener's ear, in response to a result of said comparing;

wherein said sound pressure level includes a first sound pressure level obtained next to said listener's first ear and a second sound pressure level separately obtained next to said listener's second ear;

combine said first sound pressure level and said second sound pressure level; and de-combine a result of said combining;

wherein said adjusted audio signal includes a first audio signal emitted into said listener's first ear and a second separately adjusted audio signal emitted into said listener's second ear.

20. The non-transitory storage medium of claim 19, wherein said pre-selected value is a pre-selected standard maximum sound pressure level, said computer-readable instructions further executable on said processor for directing the processor to maintain said first and second sound pressure level within said standard to prevent hearing damage.

* * * * *